United States Patent
Saito et al.

(10) Patent No.: US 11,281,029 B2
(45) Date of Patent: Mar. 22, 2022

(54) OPTICAL INTEGRATED ELEMENT AND OPTICAL MODULE

(71) Applicant: FURUKAWA ELECTRIC CO., LTD., Tokyo (JP)

(72) Inventors: Yusuke Saito, Tokyo (JP); Kazuaki Kiyota, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 43 days.

(21) Appl. No.: 16/986,830

(22) Filed: Aug. 6, 2020

(65) Prior Publication Data

US 2020/0363664 A1    Nov. 19, 2020

Related U.S. Application Data

(63) Continuation of application No. PCT/JP2019/004512, filed on Feb. 7, 2019.

(30) Foreign Application Priority Data

Feb. 8, 2018 (JP) .............................. JP2018-021088

(51) Int. Cl.
    *G02F 1/017*       (2006.01)
    *G02F 1/225*       (2006.01)
    *G02F 1/21*         (2006.01)

(52) U.S. Cl.
    CPC ........ *G02F 1/01708* (2013.01); *G02F 1/2257* (2013.01); *G02F 1/01766* (2021.01); *G02F 1/212* (2021.01); *G02F 2203/50* (2013.01)

(58) Field of Classification Search
CPC .............. G02F 1/01708; G02F 1/2257; G02F 1/01766; G02F 1/212; G02F 1/017;
(Continued)

(56) References Cited

U.S. PATENT DOCUMENTS

| 5,278,926 A | 1/1994 | Doussiere |
| 6,310,995 B1 | 10/2001 | Saini et al. |

(Continued)

FOREIGN PATENT DOCUMENTS

| JP | 5-243679 A | 9/1993 |
| JP | 7-120795 A | 5/1995 |

(Continued)

OTHER PUBLICATIONS

International Search report dated Apr. 23, 2019 in PCT/JP2019/004512 filed Feb. 7, 2019, 2 pages.

*Primary Examiner* — Robert Tavlykaev
(74) *Attorney, Agent, or Firm* — Oblon, McClelland, Maier & Neustadt, L.L.P.

(57) ABSTRACT

An optical integrated element includes: a substrate; a first waveguide region in which a lower cladding layer, a first core layer, and an upper cladding layer are sequentially laminated in this order on the substrate; and an active region in which the lower cladding layer, a second core layer, a quantum well layer that amplifies light when a current is injected, and the upper cladding layer are sequentially laminated on the substrate. Further, the second core layer and the quantum well layer are close to each other within a range of a mode field of light guided in the second core layer, and the first core layer is butt-jointed to the second core layer and the quantum well layer.

10 Claims, 10 Drawing Sheets

(58) Field of Classification Search
CPC ....... G02F 2203/50; G02B 6/12; G02B 6/122; H01S 3/0637; H01S 5/026; H01S 5/18302
USPC .......................................... 385/1–3, 14, 42
See application file for complete search history.

(56) References Cited

U.S. PATENT DOCUMENTS

| | | | | |
|---|---|---|---|---|
| 7,583,869 | B2* | 9/2009 | Kang | H01S 5/026 385/14 |
| 8,995,804 | B2* | 3/2015 | Achouche | G02B 6/12004 385/30 |
| 9,229,293 | B2* | 1/2016 | Kono | G02B 6/29352 |
| 11,002,909 | B2* | 5/2021 | Saito | H01S 5/026 |
| 2004/0096175 | A1* | 5/2004 | Tolstikhin | G02B 6/12004 385/131 |
| 2008/0069493 | A1 | 3/2008 | Shinoda et al. | |
| 2010/0158427 | A1* | 6/2010 | Choi | H01S 5/50 385/2 |
| 2014/0126905 | A1 | 5/2014 | Yonenaga et al. | |
| 2016/0351743 | A1* | 12/2016 | Yu | G02B 6/12004 |

FOREIGN PATENT DOCUMENTS

| | | | | |
|---|---|---|---|---|
| JP | 2000-56278 A | | 2/2000 | |
| JP | 2008-53501 A | | 3/2008 | |
| JP | 2009-198881 | * | 9/2009 | ............ G02F 1/017 |
| JP | 2010-224280 A | | 10/2010 | |
| JP | 2011-203572 A | | 10/2011 | |
| JP | 2014-35540 A | | 2/2014 | |
| JP | 2016-126216 A | | 7/2016 | |
| WO | WO 2013/012015 A1 | | 1/2013 | |
| WO | WO 2018/117077 A1 | | 6/2018 | |

* cited by examiner

OPTICAL INTEGRATED ELEMENT AND OPTICAL MODULE

CROSS-REFERENCE TO RELATED APPLICATION(S)

This application is a continuation of International Application No. PCT/JP2019/004512, filed on Feb. 7, 2019 which claims the benefit of priority of the prior Japanese Patent Application No. 2018-021088, filed on Feb. 8, 2018, the entire contents of which are incorporated herein by reference.

BACKGROUND

The present disclosure relates to an optical integrated element and an optical module.

In accordance with a demand for downsizing of a device for optical communication in recent years, there has been increasing a demand level for an optical integrated element in which optical elements having different functions such as a semiconductor optical amplifier and a phase modulator are integrated on the same substrate (for example, refer to Japanese Laid-open Patent Publication No. 2016-126216).

However, in a case of integrating a semiconductor optical amplifier, a phase modulator and the like on the same substrate, it is preferable that a thickness of each waveguide layer is optimized in accordance with a characteristic of each element. For example, regarding the phase modulator, it is preferable to increase the thickness of the waveguide layer to reduce electric capacity and increase speed of a response characteristic. However, regarding the semiconductor optical amplifier, it is preferable to make the thickness of the waveguide layer to be equal to or smaller than a certain thickness to suppress a decrease in a saturation output.

When optimizing thicknesses of waveguide layers of respective elements that are integrated as described above, the difference between optimum thicknesses of the waveguide layers is increased, and so there is the problem that splicing loss is increased in a jointing portion between the elements. FIG. 7 is a graph illustrating an example of splicing loss in waveguide layers having different thicknesses. As illustrated in FIG. 7, the splicing loss is increased as a ratio between the thickness of the waveguide layer as a connection destination and the thickness of the waveguide layer as a connection source is more distant from 1. If a refractive index is caused to be discontinuous at a connection part, reflection at the connection part is also caused. As the ratio of the thickness of the waveguide layer is more distant from 1 at the connection part, the reflection is increased, which further gives an adverse effect on a characteristic of the optical integrated element.

Additionally, when optimizing the thickness of the waveguide layer of each element integrated on the optical integrated element, tolerance for an optical element around the optical integrated element is also affected. That is, light that is emitted from or incident on the optical integrated element is coupled with an optical fiber, a light source or the like, but a spot size optimized for the waveguide layer of each element to be integrated is largely different from a spot size optimum for the optical fiber, the light source or the like, and so tolerance of a coupling lens between the optical integrated element and a surrounding optical element becomes hard.

As a method of solving the problem such as an increase in splicing loss, there is known a method of disposing a spot size conversion region in which the thickness of the waveguide layer varies along a waveguide direction of light between the waveguide layers having different thicknesses.

However, a difficult fabrication process is typically required to dispose such a spot size conversion region.

SUMMARY

There is a need for providing an optical integrated element and an optical module capable of preventing a problem caused by a mismatch in the spot size.

According to an embodiment, an optical integrated element includes: a substrate; a first waveguide region in which a lower cladding layer, a first core layer having a refractive index higher than the refractive index of the lower cladding layer, and an upper cladding layer having the refractive index lower than the refractive index of the first core layer are sequentially laminated in this order on the substrate; and an active region in which the lower cladding layer, a second core layer having a refractive index higher than the refractive index of the lower cladding layer, a quantum well layer that amplifies light when a current is injected, and the upper cladding layer are sequentially laminated on the substrate. Further, the second core layer and the quantum well layer are close to each other within a range of a mode field of light guided in the second core layer, and the first core layer is butt-jointed to the second core layer and the quantum well layer.

DETAILED DESCRIPTION

Figure 1A:
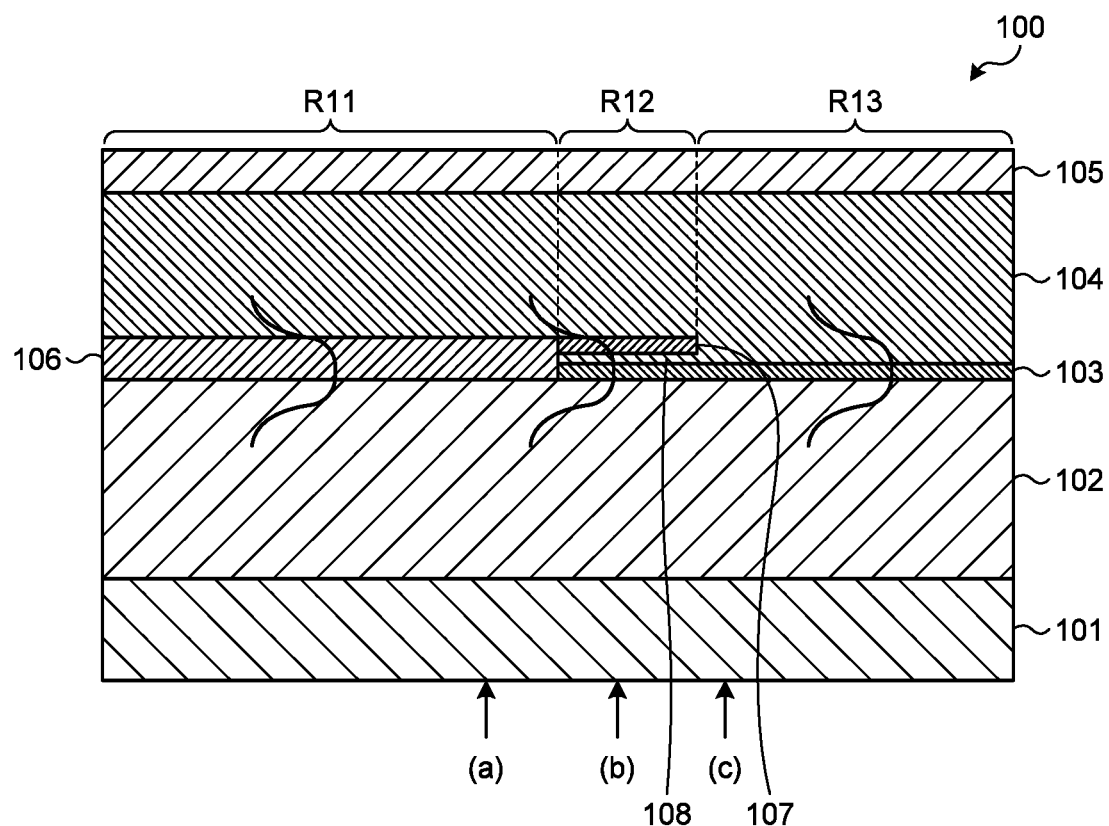
FIG. 1A is a cross-sectional view in a waveguide direction of an optical integrated element according to a first embodiment.

The following describes an optical integrated element and an optical module according to embodiments of the present disclosure in detail with reference to the drawings. The present disclosure is not limited to the embodiments described below. Throughout the drawings, the same constituent elements or corresponding constituent elements are denoted by the same reference numerals as appropriate. It should be noted that the drawings are merely schematic, and a thickness or a ratio of thickness of each layer may be different from a real thickness and ratio. A relation or a ratio between dimensions may be different between the respective drawings.

First Embodiment

Figure 1B:
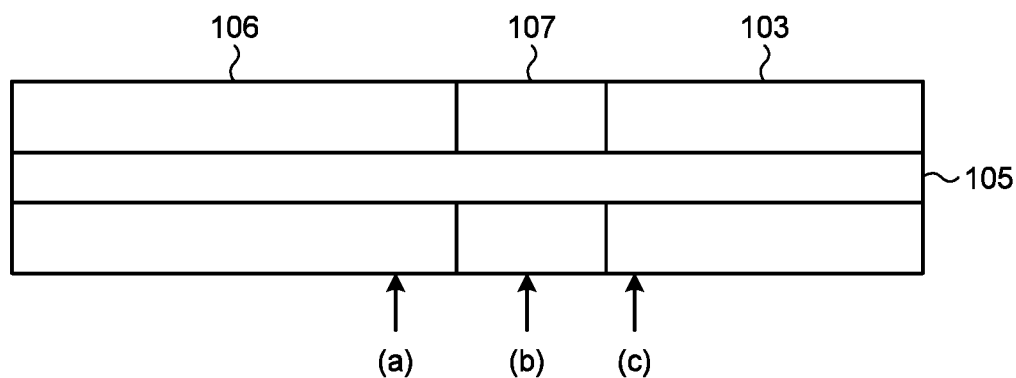
FIG. 1B is a top view of the optical integrated element according to the first embodiment.
Figure 1C:
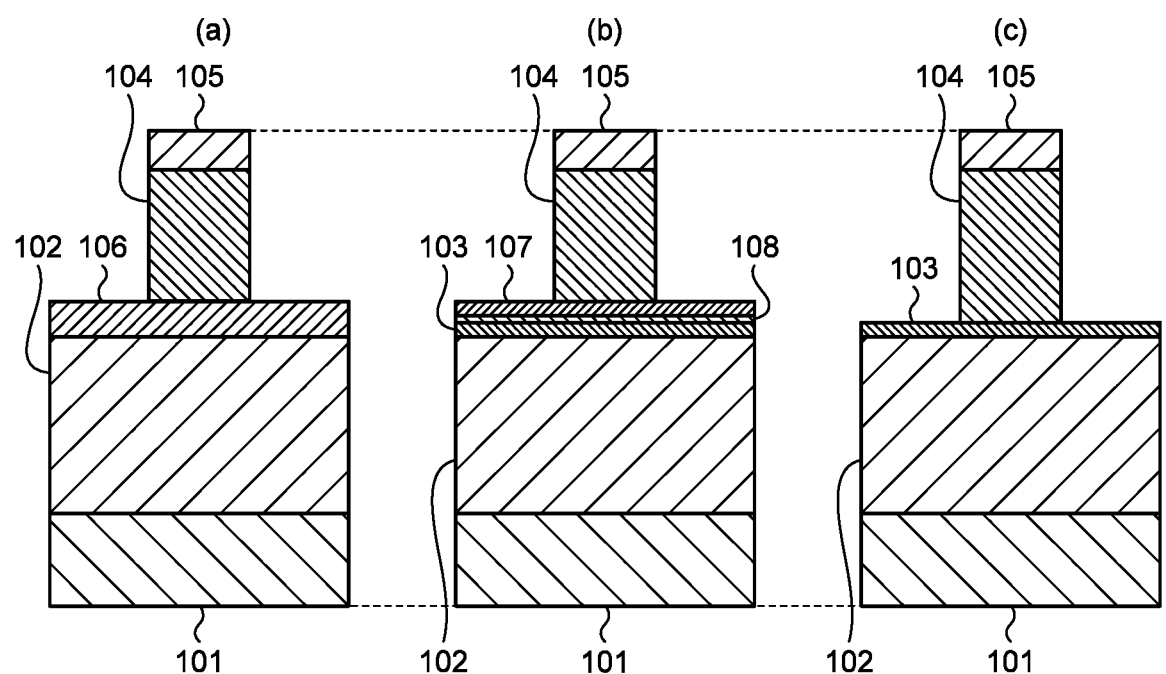
FIG. 1C is a cross-sectional view of the optical integrated element according to the first embodiment.

FIG. 1A is a cross-sectional view in a waveguide direction of an optical integrated element according to a first embodiment, FIG. 1B is a top view of the optical integrated element according to the first embodiment, and FIG. 1C is a cross-sectional view of the optical integrated element according to the first embodiment. The arrows (a) to (c) illustrated in FIG. 1A and FIG. 1B correspond to cross-sectional portions illustrated in FIG. 1C.

An optical integrated element 100 illustrated in FIG. 1A to FIG. 1C will be described as a configuration example used for a coupling region from a phase modulator to a semiconductor optical amplifier (SOA). However, the optical integrated element according to the first embodiment is not necessarily combined with the phase modulator. The optical integrated element according to the first embodiment can be combined with a device having a thick core layer, not limited to the phase modulator, to obtain an especially preferable effect. Herein, a Mach-Zehnder modulator is assumed as an example of the phase modulator. The optical integrated element 100 can also be applied to a use of causing light in a wavelength range of 1.55 μm to be incident from any of the left and the right end faces of the drawing.

As illustrated in FIG. 1A, the optical integrated element 100 includes a passive waveguide region R13 in which a lower cladding layer 102, a waveguide core 103, an upper cladding layer 104, and a contact layer 105 are sequentially (successively) laminated (stacked) on a substrate 101, and an active region R12 in which the lower cladding layer 102, the waveguide core 103, an intermediate layer 108, a quantum well layer 107, the upper cladding layer 104, and the contact layer 105 are sequentially laminated on the substrate 101. The optical integrated element 100 also includes, as a configuration example of integrating the phase modulator on the same element, a modulator region R11 in which the lower cladding layer 102, a modulator core 106, the upper cladding layer 104, and the contact layer 105 are sequentially laminated on the substrate 101. The modulator region R11 corresponds to a first waveguide region, and the passive waveguide region R13 corresponds to a second waveguide region. The passive waveguide region R13 is cascade-connected (continuously connected) to the active region R12. The modulator core 106 corresponds to a first core layer, and the waveguide core 103 corresponds to a second core layer.

Specifically, in the optical integrated element 100, the lower cladding layer 102 is laminated on the substrate 101. For example, the substrate 101 is an InP substrate, the lower cladding layer 102 is InP that is doped to cause a conductivity type to be an n-type, and has a layer thickness of 1500 nm, for example.

In the optical integrated element 100, the modulator core 106 and the waveguide core 103 are formed on the lower cladding layer 102, and the modulator core 106 is butt-jointed to the waveguide core 103. For example, the modulator core 106 is constituted of an AlGaInAs multiple quantum well having a bandgap wavelength of 1.4 μm, for example, and has a layer thickness of 500 nm, for example.

The modulator core 106 is configured to have a refractive index higher than that of the lower cladding layer 102 and the upper cladding layer 104. In the drawing, a curved line overlapping with the modulator core 106 visually exemplifies a mode field of light guided in the modulator core 106.

The bandgap wavelength of the modulator core 106 is 1.4 μm, for example, so that the modulator core 106 hardly absorbs light of 1.55 μm, and functions as a core of a waveguide. That is, the modulator core 106 is what is called a passive waveguide, and the modulator region R11 can be said to be a passive waveguide region. As described herein, the passive waveguide is a concept including a waveguide that applies reverse-bias voltage to change a phase of guided light.

The waveguide core 103 is, for example, constituted of GaInAsP having a bandgap wavelength of 1.3 μm, and configured to have a refractive index higher than that of the lower cladding layer 102 and the upper cladding layer 104. The layer thickness of the waveguide core 103 is, for example, 200 nm.

As illustrated in FIG. 1A, the quantum well layer 107 is disposed in the vicinity of the waveguide core 103 in the active region R12. Herein, the vicinity of the waveguide core 103 means a range of the mode field of light guided in the waveguide core 103, and means a range of $1/e^2$ half-width of peak intensity in the mode field, for example. When part of the quantum well layer 107 is present in the vicinity of the waveguide core 103, the waveguide core 103 and the quantum well layer 107 are close to each other within a range of the mode field of light guided in the waveguide core 103. The intermediate layer 108 is interposed between the waveguide core 103 and the quantum well layer 107, the intermediate layer 108 having composition different from that of the waveguide core 103 and the quantum well layer 107 and having the same composition as that of the upper cladding layer 104 in the present embodiment. The intermediate layer 108 may be made of material having the same composition as that of the lower cladding layer 102. The layer thickness of the intermediate layer 108 is 10 nm, for example.

A curved line overlapping with the waveguide core 103 and the quantum well layer 107 in the drawing visually exemplifies the mode field of light guided in the waveguide core 103. The modulator core 106 is butt-jointed to the quantum well layer 107 and the intermediate layer 108.

For example, the quantum well layer 107 is constituted of a GaInAsP multiple quantum well, and has a layer thickness of 100 nm, for example. The quantum well layer 107 is configured to have a refractive index higher than that of the lower cladding layer 102 and the upper cladding layer 104, and amplifies input light when a current is injected. In this case, composition of the GaInAsP multiple quantum well is adjusted to be able to amplify light in a wavelength range of 1.55 μm, for example.

The upper cladding layer 104 is laminated on the modulator core 106, the waveguide core 103, and the quantum well layer 107. The upper cladding layer 104 is, for example, InP that is doped to cause the conductivity type to be a p-type, and has a layer thickness of 2 μm, for example. Furthermore, the contact layer 105 is laminated on the upper cladding layer 104. For example, the contact layer 105 is InGaAs that is doped to be the p-type, and has a layer thickness of 500 nm, for example.

The quantum well layer 107 functions as an active layer of the SOA. That is, the mode field of light guided in the waveguide core 103 spreads to the quantum well layer 107, so that when a current is injected into the quantum well layer 107 from an electrode (not illustrated) (exemplified in FIG. 5), an amplification effect thereof (for example, a gain of approximately 10 dB) is exerted on optical power of light guided in the waveguide core 103. Such a configuration in which the quantum well layer 107 is disposed with a gap with respect to the waveguide core 103 may be called an offset quantum well. A core layer (the waveguide core 103) of the passive waveguide can be made by laminating the material of the quantum well layer in the vicinity of an upper part of the waveguide core 103, and only removing the quantum well layer 107 by etching in the passive waveguide region R13, so that there is an advantage that additional crystal growth and etching are not required.

The optical integrated element 100 is a waveguide having what is called a mesa structure, specifically, a waveguide having a low mesa structure. As illustrated in FIG. 1B and FIG. 1C, a mesa width of the low mesa structure in the optical integrated element 100 is constant, for example, 2.0 μm. In the optical integrated element 100 according to the present example, the mesa width of the low mesa structure is constant, but the mesa width of the low mesa structure may be caused to be different for each region as needed.

As illustrated in part (a) of FIG. 1C, in the modulator region R11 (first waveguide region) of the optical integrated element 100, the low mesa structure in which the contact layer 105 and the upper cladding layer 104, being shaped in a mesa, are projected is formed. Thus, as illustrated in FIG. 1B, in a top view of the modulator region R11 of the optical integrated element 100, the modulator core 106 is illustrated on both sides of the contact layer 105 as the uppermost layer of the low mesa structure.

As illustrated in part (b) of FIG. 1C, in the active region R12 of the optical integrated element 100, the low mesa structure in which the contact layer 105 and the upper cladding layer 104, being shaped in a mesa, are projected is formed. Thus, as illustrated in FIG. 1B, in a top view of the active region R12 of the optical integrated element 100, the quantum well layer 107 is illustrated on both sides of the contact layer 105 as the uppermost layer of the low mesa structure.

As illustrated in part (c) of FIG. 1C, in the passive waveguide region R13 (second waveguide region) of the optical integrated element 100, the low mesa structure in which the contact layer 105 and the upper cladding layer 104, being shaped in a mesa, are projected is formed. Thus, as illustrated in FIG. 1B, in a top view of the passive waveguide region R13 of the optical integrated element 100, the waveguide core 103 is illustrated on both sides of the contact layer 105 as the uppermost layer of the low mesa structure.

With reference to FIGS. 1A to 1C, the following describes a configuration of the optical integrated element 100 in view of a manufacturing method.

In the manufacturing method for the optical integrated element 100, first, n-InP as the lower cladding layer 102, an AlGaInAs multiple quantum well layer as the modulator core 106, and p-InP as part of the upper cladding layer 104 are successively (sequentially) formed on the InP substrate as the substrate 101 using a metal-organic chemical vapor deposition (MOCVD) method.

Next, after depositing an SiNx film on the entire surface of a layer of p-InP as part of the upper cladding layer 104, patterning is performed thereon to make a pattern slightly wider than the phase modulator, and etching is performed up to the AlGaInAs multiple quantum well layer in a region other than the region as the modulator region R11 using the SiNx film as a mask to expose a layer of n-InP as the lower cladding layer 102.

Subsequently, by directly using the SiNx film described above as a growth mask, GaInAsP as the waveguide core 103, p-InP as the intermediate layer 108, the GaInAsP multiple quantum well as the quantum well layer 107, and p-InP as part of the upper cladding layer 104 are sequentially laminated in a region as the active region R12 and a region as the passive waveguide region R13 by using the MOCVD method. Due to this, a butt joint structure of the modulator core 106, the waveguide core 103, the intermediate layer 108, and the quantum well layer 107 is formed.

Next, the SiNx film described above is temporarily removed, a new SiNx film is formed on the entire surface, and patterning is performed thereon to cause the region as the passive waveguide region R13 to be opened. By using the SiNx film as a mask, the layer of p-InP and the layer of the GaInAsP multiple quantum well are then etched. Thereafter, after removing the SiNx film, p-InP as part of the upper cladding layer 104 and p-InGaAs as the contact layer 105 are laminated by using the MOCVD method.

Next, the SiNx film is formed on the entire surface again, and patterning and etching of the low mesa structure is performed.

Thereafter, a passivation film, a resin layer and an opening thereof, an electrode for injecting a current or applying voltage and the like are formed on each portion using a known method. After processing of the surface is ended, the substrate is polished to have a desired thickness, and an electrode is formed on a back surface thereof as needed. Additionally, the substrate is cleaved to form an end face, and end face coating and element isolation are performed to complete the optical integrated element 100.

As described above, with the configuration of the optical integrated element 100, the phase modulator and the SOA can be integrated on one element with three times of crystal growth and one time of mesa structure formation.

In the optical integrated element 100 according to the first embodiment described above, the modulator core 106 is butt-jointed to the waveguide core 103 and the quantum well layer 107, so that the spot size or the mode field between the modulator core 106 having a large layer thickness, and the waveguide core 103 and the quantum well layer 107 having a large total layer thickness can be adjusted. As a result, even when an element having a thick waveguide layer such as the phase modulator and an element having a thin waveguide layer such as the SOA are integrated on one element, the spot size or the mode field can be adjusted while employing optimum configurations for both of the phase modulator and the SOA.

In the active region R12, the field of light draws near the lower cladding layer 102 side due to influence of the waveguide core 103. As a result, it is possible to reduce optical loss due to inter-valence-band absorption in the upper cladding layer 104 as p-InP (light absorption by the p-type cladding layer), so that waveguide loss can be reduced.

At the time of forming the passive waveguide region R13, the GaInAsP multiple quantum well as the quantum well layer 107 may be removed by etching, and p-InP as part of the upper cladding layer 104 and p-InGaAs as the contact layer 105 may be laminated thereon in a region in which the passive waveguide region R13 is formed, so that a passive element can be easily integrated on a subsequent stage of the SOA.

In the passive waveguide region R13, the quantum well layer 107 is not present, and the light is guided only by the waveguide core 103, so that confinement of the light is weak, and the mode filed is widened. Due to this, an optical fiber and the like are enabled to be easily connected to the passive waveguide region R13 side of the optical integrated element 100. For example, when the spot size of light is defined by a full-width of a position at which intensity is $1/e^2$ times of peak intensity, the passive waveguide region R13 can widen the spot size of light from a little less than 1 μm to a little more than 1 μm (for example, from 0.7 μm to 1.3 μm).

In the embodiment described above, the modulator core 106, the waveguide core 103, and the quantum well layer 107 are exposed to the surface on both side surfaces of the low mesa structure, but etching may be performed so that the upper cladding layer 104 is slightly left thereon.

Second Embodiment

Figure 2A:
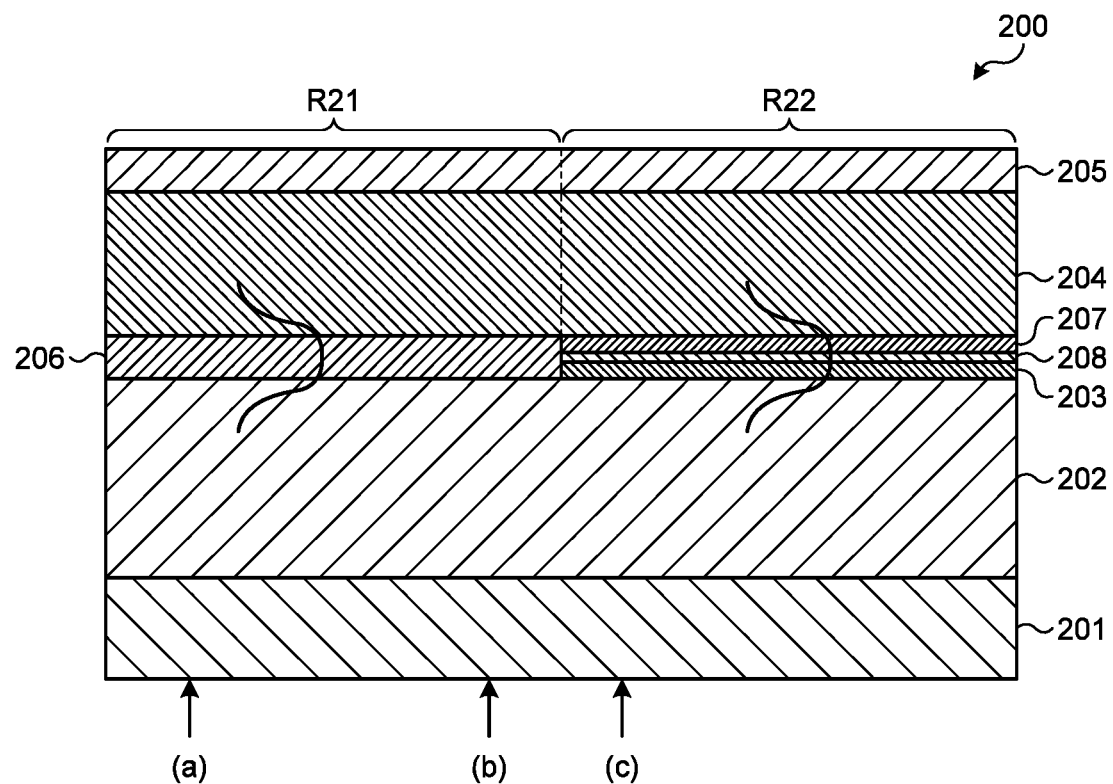
FIG. 2A is a cross-sectional view in a waveguide direction of an optical integrated element according to a second embodiment.
Figure 2B:
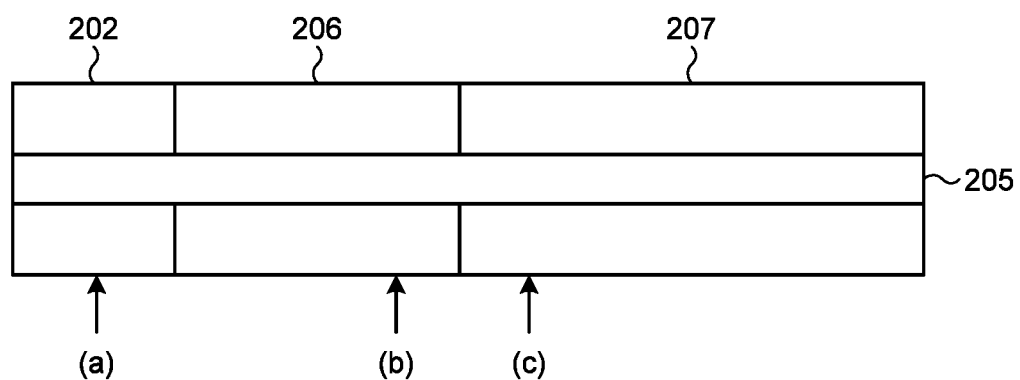
FIG. 2B is a top view of the optical integrated element according to the second embodiment.
Figure 2C:
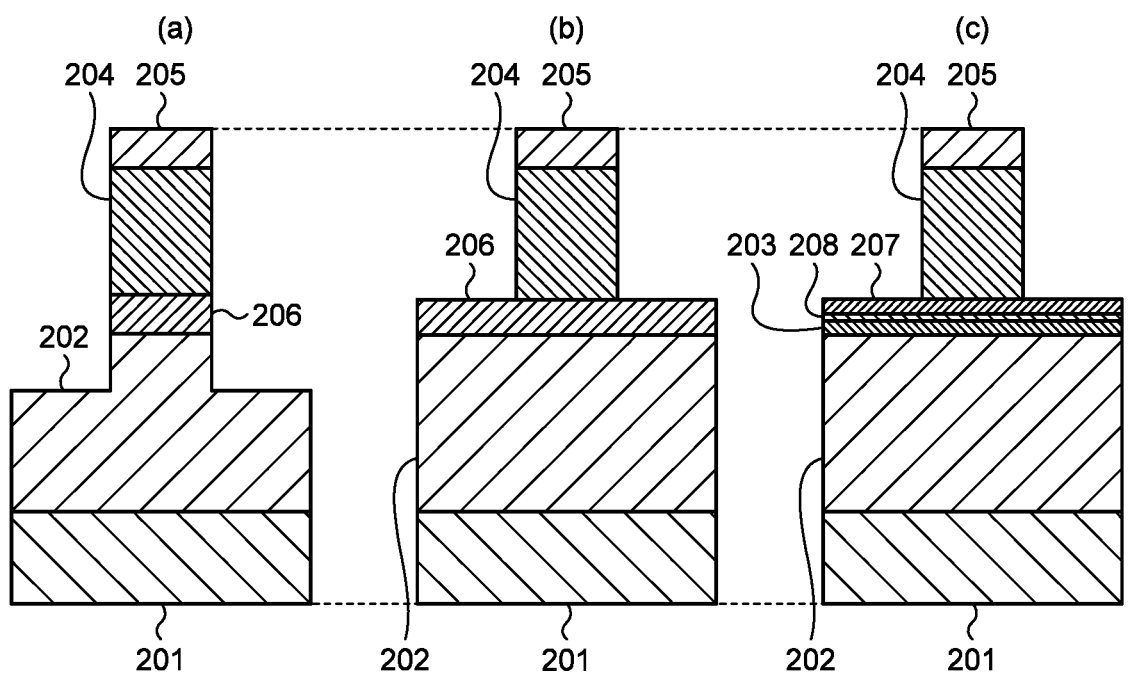
FIG. 2C is a cross-sectional view of the optical integrated element according to the second embodiment.

FIG. 2A is a cross-sectional view in a waveguide direction of the optical integrated element according to a second embodiment, FIG. 2B is a top view of the optical integrated element according to the second embodiment, and FIG. 2C is a cross-sectional view of the optical integrated element according to the second embodiment. The arrows (a) to (c) illustrated in FIG. 2A and FIG. 2B correspond to cross-sectional portions illustrated in FIG. 2C.

An optical integrated element 200 illustrated in FIG. 2A to FIG. 2C will be described as a configuration example used for a coupling region from the phase modulator to the SOA. However, the optical integrated element according to the second embodiment is not necessarily combined with the phase modulator. The optical integrated element according to the second embodiment can be combined with a device having a thick core layer, not limited to the phase modulator, to obtain an especially preferable effect. Herein, a Mach-Zehnder modulator is assumed as an example of the phase modulator. The optical integrated element 200 can also be applied to a use of causing light in a wavelength range of 1.55 μm to be incident from any of the left and the right end faces of the drawing.

As illustrated in FIG. 2A, the optical integrated element 200 includes an active region R22 in which a lower cladding layer 202, a waveguide core 203, an intermediate layer 208, a quantum well layer 207, an upper cladding layer 204, and a contact layer 205 are sequentially laminated on a substrate 201. The optical integrated element 200 also includes a modulator region R21 in which the lower cladding layer 202, a modulator core 206, the upper cladding layer 204, and the contact layer 205 are sequentially laminated on the substrate 201 as a configuration example of integrating the phase modulator on the same element. The modulator region R21 corresponds to the first waveguide region. The modulator core 206 corresponds to the first core layer, and the waveguide core 203 corresponds to the second core layer.

The substrate 201, the lower cladding layer 202, the waveguide core 203, the intermediate layer 208, the quantum well layer 207, the upper cladding layer 204, the contact layer 205, and the modulator core 206 respectively have the same component material and layer thickness as those of the substrate 101, the lower cladding layer 102, the waveguide core 103, the intermediate layer 108, the quantum well layer 107, the upper cladding layer 104, the contact layer 105, and the modulator core 106 as corresponding elements of the optical integrated element 100, so that description thereof will not be repeated.

A curved line overlapping with the modulator core 206 in the drawing visually exemplifies the mode field of light guided in the modulator core 206. A curved line overlapping with the waveguide core 203 and the quantum well layer 207 visually exemplifies the mode field of light guided in the waveguide core 203.

The optical integrated element 200 is a waveguide having a mesa structure. As illustrated in FIG. 2B and FIG. 2C, a mesa width of the mesa structure in the optical integrated element 200 is constant, for example, 2.0 μm. In the optical integrated element 200 according to the present example, the mesa width of the mesa structure is constant, but the mesa width of the low mesa structure may be caused to be different for each region as needed.

As illustrated in part (a) of FIG. 2C, in the optical integrated element 200, unlike the optical integrated element 100, a high mesa structure in which the contact layer 205, the upper cladding layer 204, the modulator core 206, and part of the lower cladding layer 202, being shaped in a mesa, are projected is formed in part of the modulator region R21 (first waveguide region) (a region of (a) on the left side of the drawing). By employing the high mesa structure in part of the modulator region R21, electric capacity of the modulator region R21 is reduced, so that modulation can be performed at higher speed. Thus, as illustrated in FIG. 2B, in a top view of a second mesa region of the modulator region R21 of the optical integrated element 200, the lower cladding layer 202 is illustrated on both sides of the contact layer 205 as the uppermost layer of the high mesa structure. On the other hand, in another part of the modulator region R21 (a region of (b) on the right side of the drawing), a low mesa structure in which the contact layer 205 and the upper cladding layer 204, being shaped in a mesa, are projected is formed. Thus, as illustrated in FIG. 2B, in a top view of the region of (b) of the modulator region R21 of the optical integrated element 200, the modulator core 206 is illustrated on both sides of the contact layer 205 as the uppermost layer of the low mesa structure. In the modulator region R21, the region of (b) (second mesa region) and the region of (a) (third mesa region) are optically connected. In the modulator core 206, the waveguide having the high mesa structure and the waveguide having the low mesa structure are converted in midstream. Typically, characteristics related to confinement of light are different between the high mesa structure and the low mesa structure, so that loss is caused when the waveguide having the high mesa structure is connected to the waveguide having the low mesa structure. Thus, as described in Japanese Patent Application Laid-open No. 2014-35540, for example, an intermediate region may be disposed between the waveguide having the high mesa structure and the waveguide having the low mesa structure, and confinement of light different from that of the high mesa structure and the low mesa structure may be implemented in the intermediate region to reduce loss in optical connection between the waveguide having the high mesa structure and the waveguide having the low mesa structure.

As illustrated in part (c) of FIG. 2C, in the active region R22 of the optical integrated element 200, the low mesa structure in which the contact layer 205 and the upper cladding layer 204, being shaped in a mesa, are projected is formed. Thus, as illustrated in FIG. 2B, in a top view of the active region R22 of the optical integrated element 200, the quantum well layer 207 is illustrated on both sides of the contact layer 205 as the uppermost layer of the low mesa structure. The active region R22 and the second mesa region are connected through the low mesa structure.

The optical integrated element 200 can be manufactured through the same process as that for the optical integrated element 100. However, the GaInAsP multiple quantum well as the quantum well layer 207 is not removed by etching. After performing patterning and etching of the low mesa structure, the SiNx film is temporarily removed, the SiNx film is deposited on the entire surface again, and patterning of the high mesa structure is performed in the modulator region R21. The high mesa structure is then formed by dry etching using the SiNx film as a mask. Thereafter, a passivation film, a resin layer and an opening thereof, an electrode for injecting a current or applying voltage and the like are formed on each portion using a known method. After processing of the surface is ended, the substrate is polished to have a desired thickness, and an electrode is formed on a back surface thereof as needed. Additionally, the substrate is cleaved to form an end face, and end face coating and element isolation are performed to complete the optical integrated element 200.

As described above, with the configuration of the optical integrated element 200, the phase modulator and the SOA can be integrated on one element with three times of crystal growth and two times of mesa structure formation.

In the optical integrated element 200 according to the second embodiment described above, the modulator core 206 is butt-jointed to the waveguide core 203 and the quantum well layer 207, so that the mode field between the modulator core 206 having a large layer thickness, and the waveguide core 203 and the quantum well layer 207 having a large total layer thickness can be adjusted. As a result, even when an element having a thick waveguide layer such as the phase modulator and an element having a thin waveguide layer such as the SOA are integrated on one element, the mode field can be adjusted while employing optimum configurations for both of the phase modulator and the SOA. In the active region R22, the field of light draws near the lower cladding layer 202 side due to influence of the waveguide core 203, so that it is possible to reduce optical loss due to inter-valence-band absorption in the upper cladding layer 204 as p-InP, and waveguide loss can be reduced.

By causing a partial region of the modulator region R21 to have the high mesa structure, parasitic capacity of that region can be reduced, which is appropriate for modulation at higher speed.

In the embodiment described above, the modulator core 206, the waveguide core 203, and the quantum well layer 207 are exposed to the surface on both side surfaces of the low mesa structure, but etching may be performed so that the upper cladding layer 204 is slightly left thereon.

Third Embodiment

Figure 3A:
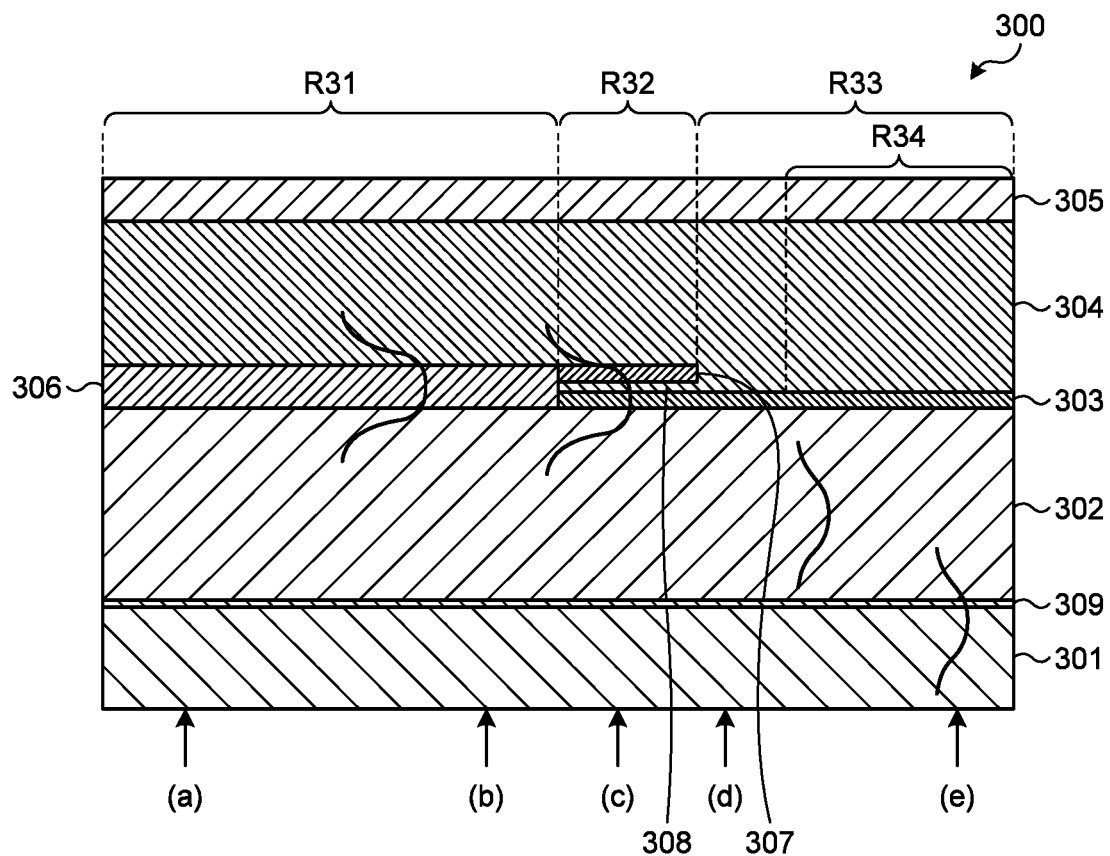
FIG. 3A is a cross-sectional view in a waveguide direction of an optical integrated element according to a third embodiment.
Figure 3B:
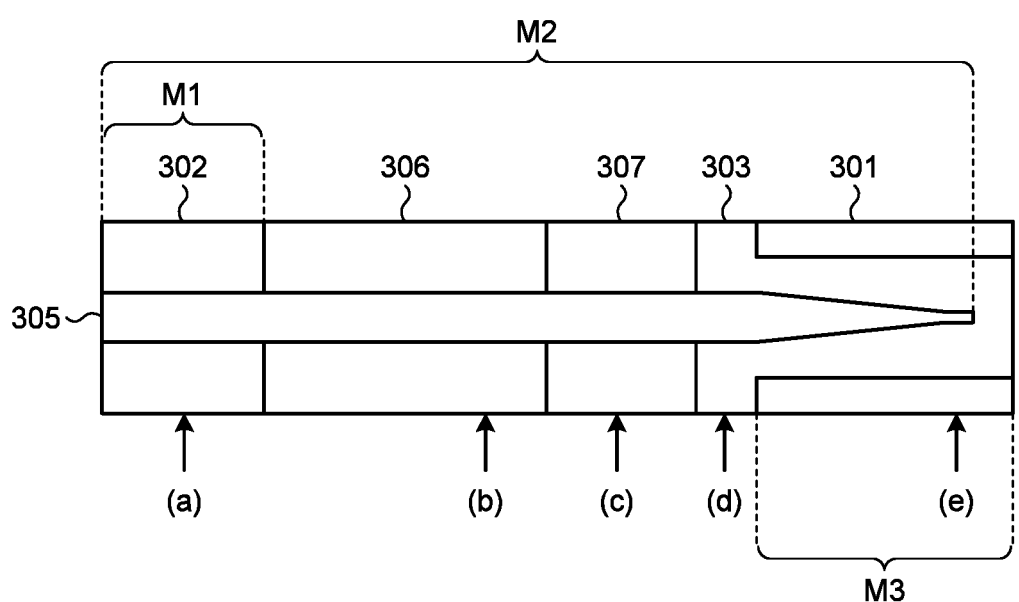
FIG. 3B is a top view of the optical integrated element according to the third embodiment.
Figure 3C:
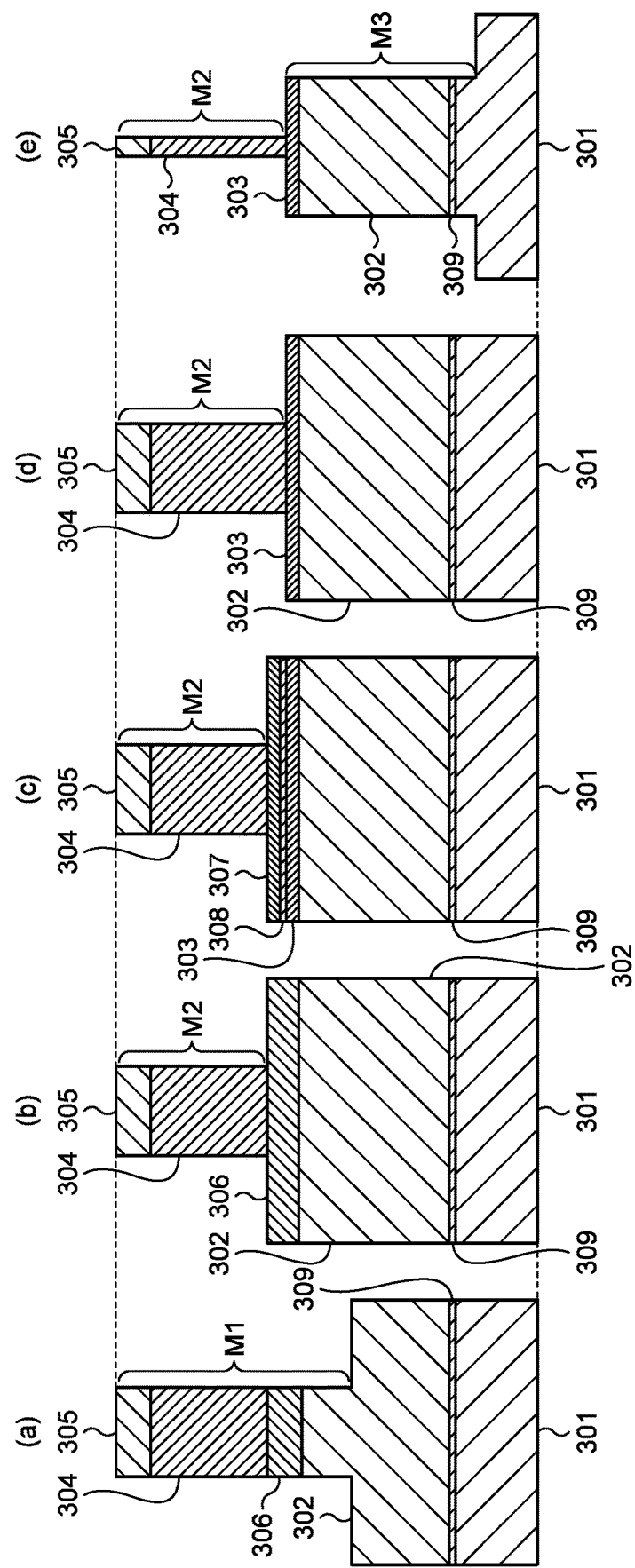
FIG. 3C is a cross-sectional view of the optical integrated element according to the third embodiment.

FIG. 3A is a cross-sectional view in a waveguide direction of the optical integrated element according to a third embodiment, FIG. 3B is a top view of the optical integrated element according to the third embodiment, and FIG. 3C is a cross-sectional view of the optical integrated element according to the third embodiment. The arrows (a) to (e) illustrated in FIG. 3A and FIG. 3B correspond to cross-sectional portions illustrated in FIG. 3C.

An optical integrated element 300 illustrated in FIG. 3A to FIG. 3C will be described as a configuration example used for a coupling region from the phase modulator to the SOA. However, the optical integrated element according to the third embodiment is not necessarily combined with the phase modulator. The optical integrated element according to the third embodiment can be combined with a device having a thick core layer, not limited to the phase modulator, to obtain an especially preferable effect. Herein, a Mach-Zehnder modulator is assumed as an example of the phase modulator. The optical integrated element 300 can also be applied to a use of causing light in a wavelength range of 1.55 µm to be incident from any of the left and the right end faces of the drawing.

As illustrated in FIG. 3A, the optical integrated element 300 includes a passive waveguide region R33 in which a spot size converter (SSC) core 309, a lower cladding layer 302, a waveguide core 303, an upper cladding layer 304, and a contact layer 305 are sequentially laminated on a substrate 301. The optical integrated element 300 also includes an active region R32 in which the SSC core 309, the lower cladding layer 302, the waveguide core 303, an intermediate layer 308, a quantum well layer 307, the upper cladding layer 304, and the contact layer 305 are sequentially laminated on the substrate 301. The optical integrated element 300 further includes a modulator region R31 in which the SSC core 309, the lower cladding layer 302, a modulator core 306, the upper cladding layer 304, and the contact layer 305 are sequentially laminated on the substrate 301 as a configuration example of integrating the phase modulator on the same element. The passive waveguide region R33 includes a spot size conversion region R34 having a two-stage mesa structure as illustrated in FIG. 3B and FIG. 3C described later. The modulator region R31 corresponds to the first waveguide region. The passive waveguide region R33 corresponds to the second waveguide region. The passive waveguide region R31 is cascade-connected to the active region R32. The modulator core 306 corresponds to the first core layer, and the waveguide core 303 corresponds to the second core layer. The SSC core 309 corresponds to a third core layer.

The substrate 301, the lower cladding layer 302, the waveguide core 303, the intermediate layer 308, the quantum well layer 307, the upper cladding layer 304, the contact layer 305, and the modulator core 306 respectively have the same component material and layer thickness as those of the substrate 101, the lower cladding layer 102, the waveguide core 103, the intermediate layer 108, the quantum well layer 107, the upper cladding layer 104, the contact layer 105, and the modulator core 106 as corresponding elements of the optical integrated element 100, so that description thereof will not be repeated.

The SSC core 309 is a core for spot size conversion laminated between the substrate 301 and the lower cladding layer 302. The SSC core 309 is configured to have a refractive index higher than that of the substrate 301 and the lower cladding layer 302, constituted of GaInAsP having a refractive index of 3.34, for example, and has a layer thickness of 100 nm, for example. Instead of directly laminating the SSC core 309 on the substrate 301, a separate InP layer may be laminated on the substrate 301, and the SSC core 309 may be further laminated thereon.

The optical integrated element 300 is a waveguide having the mesa structure, but the mesa structure is different for each region of the optical integrated element 300. With reference to FIG. 3A to FIG. 3C in parallel, the following describes the mesa structure in each region of the optical integrated element 300.

As illustrated in FIG. 3B and FIG. 3C, the mesa structure of the optical integrated element 300 has three stages. That is, the optical integrated element 300 has a first mesa structure M1 as the high mesa structure in which the contact layer 305, the upper cladding layer 304, the modulator core 306, and part of the lower cladding layer 302, being shaped in a mesa, are projected in part of the modulator region R31 (a region of (a)). In another part of the modulator region R31 (a region of (b)), the active region R32 (a region of (c)), and a region other than the spot size conversion region R34 in the passive waveguide region R33 (a region of (d)), the optical integrated element 300 has a second mesa structure M2 as the low mesa structure in which the contact layer 305 and the upper cladding layer 304, being shaped in a mesa, are projected. In part of the spot size conversion region R34, the optical integrated element 300 has a third mesa structure M3 as the high mesa structure in which the waveguide core 303, the lower cladding layer 302, the SSC core 309, and part of the substrate 301, being shaped in a mesa, are projected in addition to the second mesa structure M2. The region of the passive waveguide region R33 having the second mesa structure M2 and the third mesa structure M3 functions as a spot size converter as described later. The region having the second mesa structure M2 corresponds to a first mesa region.

As illustrated in parts (a) to (d) of FIG. 3C, in the region in which the third mesa structure M3 is not formed, widths of the first mesa structure M1 and the second mesa structure M2 are constant, for example, 2.0 μm. On the other hand, as illustrated in part (e) of FIG. 3C, in the region in which the third mesa structure M3 is formed, the width of the second mesa structure M2 is continuously reduced as being closer to an end face. That is, the mesa width of the third mesa structure M3 in the spot size conversion region R34 is larger than the mesa width of the low mesa structure (second mesa structure M2) in the first mesa region, and the mesa width of the second mesa structure M2 continuously varies in the spot size conversion region M34 having the second mesa structure M2. As illustrated in FIG. 3B, the width of the second mesa structure M2 is preferably caused to be a certain width (for example, 0.5 μm) at a terminal part, and preferably has a structure of being discontinuous (the width becomes zero) without being extended to the end face of the optical integrated element 300. Accordingly, an effect of reducing fluctuations in spot size conversion can be obtained.

The following describes the reason why the configuration described above reduces fluctuations in spot size conversion. In the optical integrated element 300 having the configuration described above, as illustrated in FIG. 3A, the mode field of light guided in the waveguide core 303 is adiabatically moved to the SSC core 309 as the width of the second mesa structure M2 is reduced. A curved line illustrated in the drawing visually exemplifies the mode field of light moving from the waveguide core 303 to the SSC core 309.

At this point, the mode field of light moving from the waveguide core 303 to the SSC core 309 is subjected to action of being shifted toward an upper side by the second mesa structure M2, and magnitude of the action of shifting the mode field of light toward the upper side is determined depending on the width of the second mesa structure M2. That is, magnitude of the mode filed of light in a vertical direction becomes susceptible to accuracy of the width of the second mesa structure M2. Thus, when the second mesa structure M2 is caused to be a discontinuous structure without being extended to the end face of the optical integrated element 300, a thin mesa structure that is more susceptible to accuracy in a width direction is not made, so that the effect of reducing fluctuations in spot size conversion can be obtained.

The following describes the configuration of the optical integrated element 300 in view of a manufacturing method.

In the manufacturing method for the optical integrated element 300, first, GaInAsP as the SSC core 309, n-InP as the lower cladding layer 302, GaInAsP as the waveguide core 303, p-InP as the intermediate layer 308, the GaInAsP multiple quantum well as the quantum well layer 307, and p-InP as part of the upper cladding layer 304 are successively formed on the InP substrate as the substrate 301 using the MOCVD method.

Next, after depositing the SiNx film on the entire surface of the layer of p-InP as part of the upper cladding layer 304, patterning is performed to cause the passive waveguide region R33 that is not the SOA to be opened. The layer of p-InP and the layer of the AlGaInAs multiple quantum well are then etched using the SiNx film as a mask. Thereafter, after removing the SiNx film, p-InP as part of the upper cladding layer 304 and p-InGaAs as the contact layer 305 are laminated by using the MOCVD method.

Next, the SiNx film is formed on the entire surface again, and patterning and etching of the second mesa structure M2 are performed. After temporarily removing the SiNx film, the SiNx film is formed on the entire surface, and patterning and etching of the first mesa structure M1 and the third mesa structure M3 are performed.

Thereafter, a passivation film, a resin layer and an opening thereof, an electrode for injecting a current or applying voltage and the like are formed on each portion using a known method. After processing of the surface is ended, the substrate is polished to have a desired thickness, and an electrode is formed on a back surface thereof as needed. Additionally, the substrate is cleaved to form an end face, and end face coating and element isolation are performed to complete the optical integrated element 300.

With the structure described above, in the optical integrated element 300, the SOA and the spot size converter can be integrated on one element, and the spot size converter can widen the spot size from a little less than 1 μm to approximately 3 μm.

As described above, the optical integrated element 300 can be easily manufactured because the SOA and the spot size converter can be integrated on one element with three times of crystal growth and two times of mesa structure formation. The optical integrated element 300 described above has a three-stage mesa structure, but increase in the stages of the mesa structure does not mean deviation from the gist of the present disclosure.

In the optical integrated element 300 according to the third embodiment described above, the modulator core 306 is butt-jointed to the waveguide core 303 and the quantum well layer 307, so that the mode field between the modulator core 306 having a large layer thickness, and the waveguide core 303 and the quantum well layer 307 having a large total layer thickness can be adjusted. As a result, even when an element having a thick waveguide layer such as the phase modulator and an element having a thin waveguide layer such as the SOA are integrated on one element, the mode field can be adjusted while employing optimum configurations for both of the phase modulator and the SOA.

In the active region R32, the field of light draws near the lower cladding layer 302 side due to influence of the waveguide core 303. As a result, it is possible to reduce optical loss due to inter-valence-band absorption in the upper cladding layer 304 as p-InP, so that waveguide loss can be reduced.

By causing a partial region of the modulator region R31 to have the high mesa structure, parasitic capacity of that region can be reduced, which is appropriate for modulation at higher speed.

At the time of forming the passive waveguide region R33, the GaInAsP multiple quantum well as the quantum well layer 307 may be removed by etching, and p-InP as part of the upper cladding layer 304 and p-InGaAs as the contact layer 105 may be laminated thereon in a region in which the passive waveguide region R33 is formed, so that a passive element can be easily integrated on a subsequent stage of the SOA.

In the embodiment described above, the modulator core 306, the waveguide core 303, and the quantum well layer 307 are exposed to the surface on both side surfaces of the low mesa structure, but etching may be performed so that the upper cladding layer 304 is slightly left thereon.

Alternatively, for example, as described in Japanese Patent Application Laid-open No. 2014-35540, an intermediate region may be disposed between the waveguide having the high mesa structure and the waveguide having the low mesa structure, and confinement of light different from that of the high mesa structure and the low mesa structure may be implemented in the intermediate region to reduce loss in optical connection between the waveguide having the high mesa structure and the waveguide having the low mesa structure.

Fourth Embodiment

Figure 4:
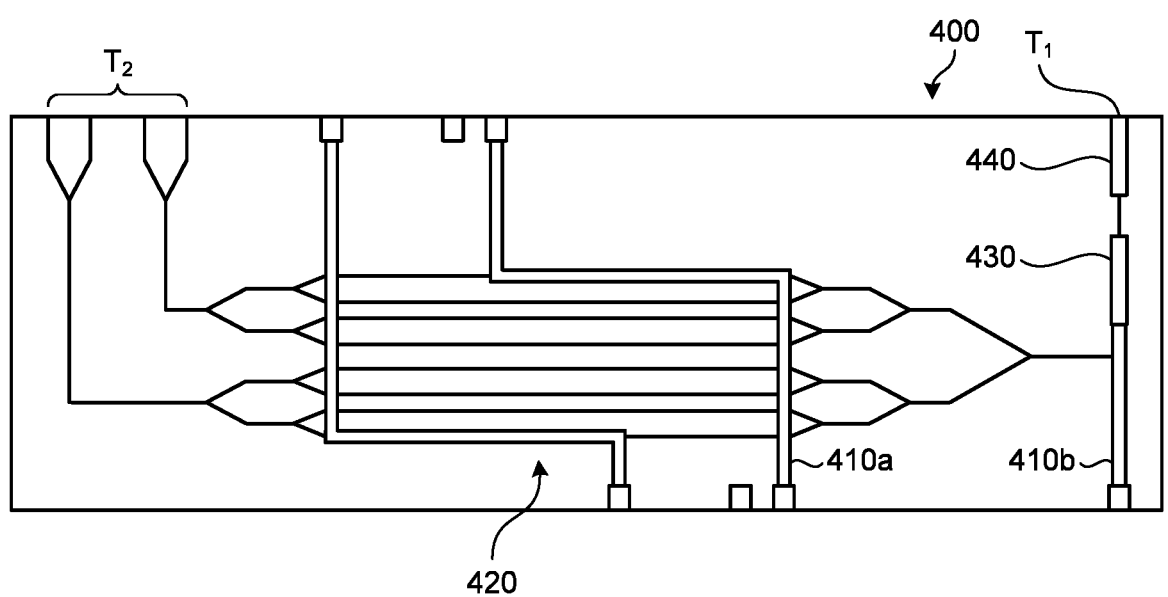
FIG. 4 is a schematic top view of an optical integrated element according to a fourth embodiment.

An optical integrated element 400 according to a fourth embodiment is an optical integrated element to which the characteristic of the third embodiment is applied. FIG. 4 is a schematic top view of the optical integrated element 400 according to the fourth embodiment.

As illustrated in FIG. 4, the optical integrated element 400 according to the fourth embodiment is an optical integrated element obtained by integrating a Mach-Zehnder IQ modulator 420, an SOA 430, and an SSC 440 on one element. For example, the optical integrated element 400 is utilized as a modulator that modulates light entered from an end part $T_1$ to be emitted from an end part $T_2$. The IQ modulator is a modulator that modulates both of amplitude and a phase of light.

As illustrated in FIG. 4, the optical integrated element 400 has what is called a U-turn configuration in which arrangement of the IQ modulator 420 is orthogonal to arrangement of the SOA 430 and the SSC 440, and a mounting area of the optical integrated element 400 can be reduced.

Additionally, with the optical integrated element 400 having the U-turn configuration, wet etching is facilitated at the time of making a mesa structure of the IQ modulator 420, the SOA 430, and the SSC 440 due to a relation of plane orientation of the substrate. Specifically, the mesa structure is preferably made in a direction parallel with [011] direction of the substrate for the SOA 430 and the SSC 440, and the mesa structure is preferably made in a direction parallel with [01-1] direction of the substrate for the IQ modulator 420. In the IQ modulator 420, a phase change is caused by using quantum-confined Stark effect. A Pockels effect exhibits with the same sign as that of the Stark effect in the [01-1] direction, and the Pockels effect exhibits with a sign opposite to that of the Stark effect in the [011] direction. Thus, when the mesa structure is made in the [01-1] direction, efficiency of the phase change in the IQ modulator 420 is improved. That is, assuming that a vertical direction of the drawing is the [011] direction of the substrate, and a horizontal direction of the drawing is the [01-1] direction of the substrate, when arrangement of the IQ modulator 420 is caused to be orthogonal to arrangement of the SOA 430 and the SSC 440, the arrangement thereof becomes appropriate for plane orientation of the substrate.

In the optical integrated element 400, the SOA 430 and the SSC 440 are inserted into only a previous stage of the IQ modulator 420, but the SOA 430 and the SSC 440 may also be inserted into a subsequent stage thereof. The SOA 430 and the SSC 440 may be inserted into only a subsequent stage.

Figure 5:
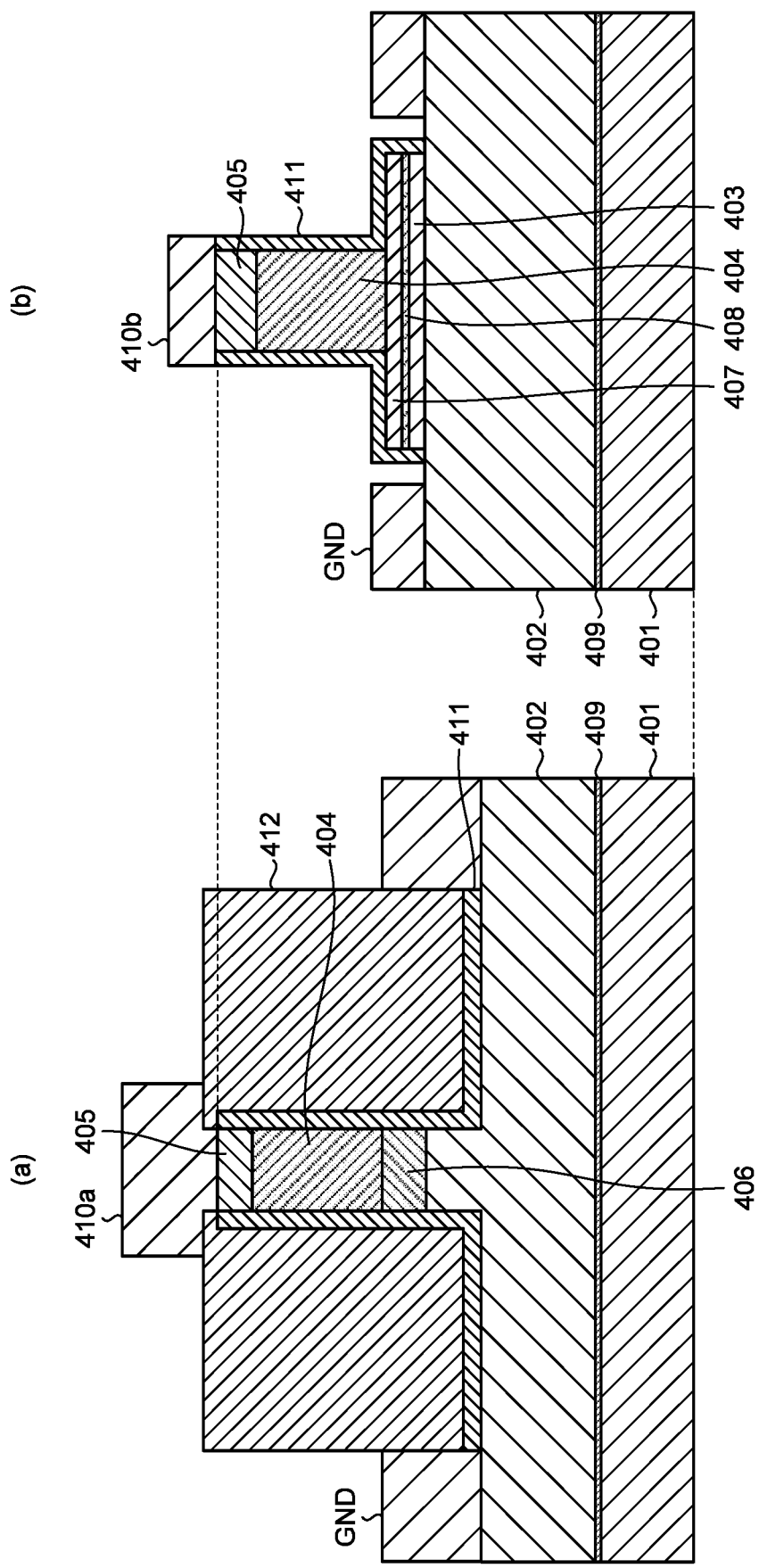
FIG. 5 is a cross-sectional view illustrating an example of forming a passivation film and an electrode.

FIG. 5 is a cross-sectional view illustrating an example of forming a passivation film and an electrode. Part (a) of FIG. 5 corresponds to a cross section of the IQ modulator 420 perpendicular to an extending direction of the waveguide, and part (b) of FIG. 5 corresponds to a cross section of the SOA 430 perpendicular to the extending direction of the waveguide. As illustrated in part (a) of FIG. 5, in the IQ modulator 420, an SSC core 409, a lower cladding layer 402, a modulator core 406, an upper cladding layer 404, and a contact layer 405 are sequentially laminated on a substrate 401. The mesa structure of the IQ modulator 420 in which the contact layer 405, the upper cladding layer 404, the modulator core 406, and part of the lower cladding layer 402, being shaped in a mesa, are projected is coated by a passivation film 411 made of $SiO_2$ or SiNx as material, for example. Additionally, a resin layer 412 made of a resin such as BCB or polyimide as material, for example, is formed on an outer side of the passivation film 411. The configuration is such that a current flows from an electrode 410a formed on the contact layer 405 to a grounding electrode GND formed on the lower cladding layer 402. On the other hand, as illustrated in part (b) of FIG. 5, in the SOA 430, the SSC core 409, the lower cladding layer 402, a waveguide core 403, an intermediate layer 408, a quantum well layer 407, the upper cladding layer 404, and the contact layer 405 are sequentially laminated on the substrate 401. In the mesa structure of the SOA 430, the low mesa structure in which the contact layer 405 and the upper cladding layer 404, being shaped in a mesa, are projected and the high mesa structure in which the quantum well layer 407, the intermediate layer 408, and the waveguide core, being shaped in a mesa, are projected are coated by the passivation film 411 made of $SiO_2$ or SiNx as material, for example. The configuration is such that a current flows from an electrode 410b formed on the contact layer 405 to the grounding electrode GND formed on the lower cladding layer 402.

With the structure described above, in the optical integrated element 400, a device having a thick waveguide layer such as the IQ modulator 420, the SOA 430, and the two-stage SSC 440 can be integrated on one element, and the spot size converter can widen the spot size defined by the full-width of $1/e^2$ from a little less than 1 μm to approximately 3 μm.

As described above, in the optical integrated element 400, a device having a thick waveguide layer such as the IQ modulator 420, the SOA 430, and the two-stage SSC 440 can be integrated on one element. The optical integrated element 400 described above has the two-stage mesa structure, but increase in the stages of the mesa structure does not mean deviation from the gist of the present disclosure.

The optical integrated element 400 according to the fourth embodiment described above has an advantage that, although the optical integrated element 400 can obtain all advantages of the optical integrated elements according to the first embodiment to the third embodiment, the number of times of crystal growth and the number of times of mesa structure formation are not increased at the time of manufacturing.

Fifth Embodiment

Figure 6:
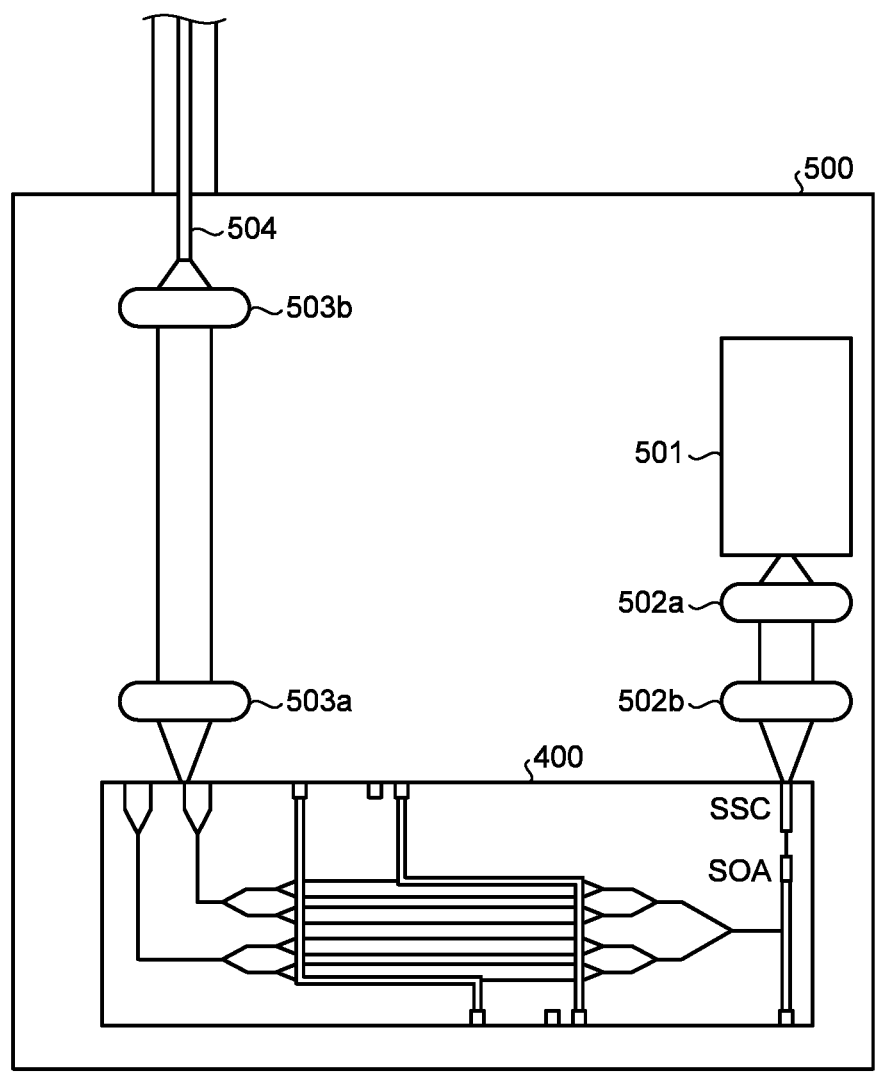
FIG. 6 is a schematic configuration diagram of an optical module according to a fifth embodiment.
Figure 7:
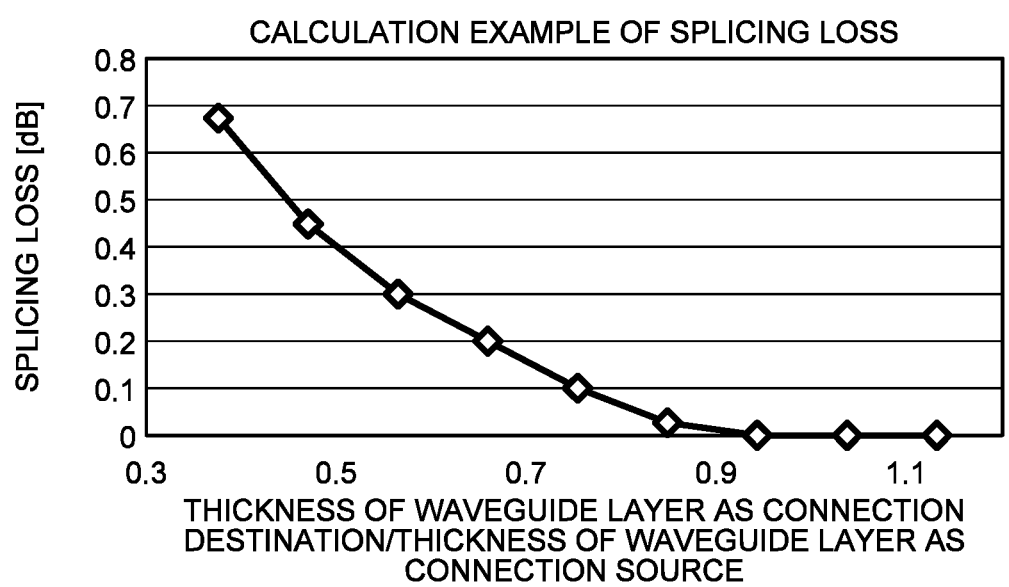
FIG. 7 is a graph illustrating an example of splicing loss in waveguide layers having different thicknesses.

FIG. 6 is a schematic configuration diagram of a transmitter module as an optical module according to a fifth embodiment. A light transmitter module 500 according to the fifth embodiment is a light transmitter module using any one of the optical integrated elements according to the first embodiment to the fourth embodiment described above. Exemplified herein is a light transmitter module using the optical integrated element 400 according to the fourth embodiment.

As illustrated in FIG. 6, the light transmitter module 500 includes a wavelength-tunable semiconductor laser 501, first lenses 502a and 502b, the optical integrated element 400, second lenses 503a and 503b, and an optical fiber 504.

The wavelength-tunable semiconductor laser 501 is a light source that outputs laser light to be a carrier wave. The laser light emitted from the wavelength-tunable semiconductor laser 501 is collimated by the first lens 502a, and caused to be incident on an incident end face of the optical integrated element 400 by the first lens 502b thereafter.

The optical integrated element 400 is an optical integrated element obtained by integrating the IQ modulator, the SOA, and the SSC on one element as described above. A spot size of the laser light incident on the incident end face of the optical integrated element 400 is converted by the SSC, the optical power thereof is amplified by the SOA, and is subjected to modulation by the IQ modulator.

The laser light emitted from the optical integrated element 400 is collimated by the second lens 503a, is caused to be incident on an end face of the optical fiber 504 by the second lens 503b, and is derived to the outside of the light transmitter module 500 by the optical fiber 504.

In the light transmitter module 500 having the configuration described above, tolerance for coupling at the time when the light is incident on the optical integrated element 400 from the wavelength-tunable semiconductor laser 501 is relieved due to action of the SSC included in the optical integrated element 400. Additionally, tolerance for coupling at the time when the light is incident on the optical fiber 504 from the optical integrated element 400 is also relieved due to action of the SSC included in the optical integrated element 400.

The optical integrated element and the optical module according to the present disclosure exhibit an effect of being able to prevent the problem caused by a mismatch in the spot size.

As described above, the optical integrated element and the optical module according to an embodiment of the present disclosure are preferably used in optical communications.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical integrated element comprising:
a substrate;
a first waveguide region in which a lower cladding layer, a first core layer having a refractive index higher than the refractive index of the lower cladding layer, and an upper cladding layer having a refractive index lower than the refractive index of the first core layer are sequentially laminated in this order on the substrate; and
an active region in which the lower cladding layer, a second core layer having a refractive index higher than the refractive index of the lower cladding layer, a quantum well layer that amplifies light when a current is injected, and the upper cladding layer are sequentially laminated on the substrate, wherein
the second core layer and the quantum well layer are close to each other within a range of a mode field of light guided in the second core layer, and
the first core layer is butt-jointed to the second core layer and the quantum well layer.

2. The optical integrated element according to claim 1, comprising:
an inter mediate layer interposed between the second core layer and the quantum well layer, the intermediate layer having composition different from composition of the second core layer and the quantum well layer.

3. The optical integrated element according to claim 2, wherein the intermediate layer has a same composition as composition of the lower cladding layer or the upper cladding layer.

4. The optical integrated element according to claim 1, wherein a conductivity type of the lower cladding layer is an n-type, and a conductivity type of the upper cladding layer is a p-type.

5. The optical integrated element according to claim 1, further comprising a second waveguide region in which the lower cladding layer, the second core layer, and the upper cladding layer are sequentially laminated on the substrate, wherein
the second waveguide region is cascade-connected to the active region.

6. The optical integrated element according to claim 5, wherein
the second waveguide region includes a third core layer that is laminated between the substrate and the lower cladding layer and has a refractive index higher than a refractive index of the substrate and the lower cladding layer,
at least a part of the second waveguide region includes a first mesa region having a low mesa structure in which the upper cladding layer, which is shaped in a mesa, is projected,
the second waveguide region includes a spot size conversion region having a mesa structure in which the second core layer, the lower cladding layer, and the third core layer, which are shaped in a mesa, are projected, and
a mesa width of the mesa structure in the spot size conversion region is wider than a mesa width of the low mesa structure in the first mesa region, and the mesa width of the low mesa structure in the first mesa region continuously varies in the spot size conversion region having the mesa structure.

7. The optical integrated element according to claim 1, wherein
the first waveguide region includes a second mesa region having a low mesa structure in which the upper cladding layer, which is shaped in a mesa, is projected, and a third mesa region having a high mesa structure in which the upper cladding layer, the first core layer, and a part of the lower cladding layer, which are shaped in a mesa, are projected,
the active region has the low mesa structure,
the active region and the second mesa region are connected through the low mesa structure, and
the low mesa structure of the second mesa region and the high mesa structure of the third mesa region are optically connected.

8. The optical integrated element according to claim 1, wherein
   the first waveguide region on the substrate includes a modulator region functioning as a phase modulator that modulates a phase of guided light, and
   the first core layer in the modulator region is a modulator core layer that guides light.

9. The optical integrated element according to claim 8, wherein the phase modulator is a Mach-Zehnder modulator.

10. An optical module comprising:
   the optical integrated element according to claim 1.

* * * * *